United States Patent
Villa et al.

(10) Patent No.: US 11,462,289 B2
(45) Date of Patent: *Oct. 4, 2022

(54) WORDLINE CAPACITANCE BALANCING

(71) Applicant: Micron Technology, Inc., Boise, ID (US)

(72) Inventors: Corrado Villa, Sovico (IT); Shane D. Moser, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/236,729

(22) Filed: Apr. 21, 2021

(65) Prior Publication Data

US 2021/0335436 A1    Oct. 28, 2021

Related U.S. Application Data

(63) Continuation of application No. 16/518,824, filed on Jul. 22, 2019, now Pat. No. 10,998,074.

(51) Int. Cl.

| | |
|---|---|
| *G11C 29/18* | (2006.01) |
| *G11C 11/419* | (2006.01) |
| *G11C 11/408* | (2006.01) |
| *G11C 11/22* | (2006.01) |

(Continued)

(52) U.S. Cl.
CPC .......... *G11C 29/18* (2013.01); *G11C 11/2253* (2013.01); *G11C 11/2275* (2013.01); *G11C 11/4085* (2013.01); *G11C 11/419* (2013.01); *G11C 13/003* (2013.01); *G11C 13/0028* (2013.01); *G11C 16/0483* (2013.01); *G11C 2029/1804* (2013.01)

(58) Field of Classification Search
CPC ..... G11C 29/18; G11C 29/025; G11C 29/028; G11C 29/1201; G11C 11/2253; G11C 11/2275; G11C 11/4085; G11C 11/419; G11C 11/2257; G11C 13/0028; G11C 13/003; G11C 16/0483; G11C 2029/1804; G11C 8/08; G11C 8/14; G11C 5/063
See application file for complete search history.

(56) References Cited

U.S. PATENT DOCUMENTS

| | | | |
|---|---|---|---|
| 7,375,544 B2 * | 5/2008 | Iwata | G11C 7/14 |
| | | | 365/207 |
| 2002/0196669 A1 | 12/2002 | Hsu et al. | |
| 2007/0234259 A1 | 10/2007 | Drumm et al. | |

(Continued)

*Primary Examiner* — Sultana Begum
(74) *Attorney, Agent, or Firm* — Holland & Hart LLP

(57) ABSTRACT

Methods, systems, and devices for word line capacitance balancing are described. A memory device may include a set of memory tiles, where one or more memory tiles may be located at a boundary of the set. Each boundary memory tile may have a word line coupled with a driver and a subarray of memory cells, and may also include a load balancing component (e.g., a capacitive component) coupled with the driver. In some examples, the load balancing component may be coupled with an output line of the driver (such as a word line) or an input of the driver (such as a line providing a source signal). The load balancing component may adapt a load output from the driver to the subarray of memory cells such that the load of the memory tile at the boundary may be similar to the load of other memory tiles not at the boundary.

20 Claims, 7 Drawing Sheets

(51) Int. Cl.
  *G11C 13/00*   (2006.01)
  *G11C 16/04*   (2006.01)

(56) References Cited

U.S. PATENT DOCUMENTS

| | | |
|---|---|---|
| 2009/0040802 A1 | 2/2009 | Arakawa |
| 2009/0175081 A1 | 7/2009 | Kim |
| 2010/0128517 A1 | 5/2010 | Bedeschi et al. |

\* cited by examiner

WORDLINE CAPACITANCE BALANCING

CROSS REFERENCE

The present Application for Patent is a continuation of U.S. patent application Ser. No. 16/518,824 by Villa et al., entitled "WORDLINE CAPACITANCE BALANCING," filed Jul. 22, 2019, assigned to the assignee hereof, and is expressly incorporated by reference in its entirety herein.

BACKGROUND

The following relates generally to a system that includes at least one memory device and more specifically to word line capacitance balancing.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

For some memory devices, subarrays of memory cells (e.g., memory tiles) may be arranged such that circuitry for some memory tiles experiences a different load than circuitry for other memory tiles. Such inconsistent loading across respective memory tiles may result in higher error rates and other issues.

DETAILED DESCRIPTION

Figure 1:
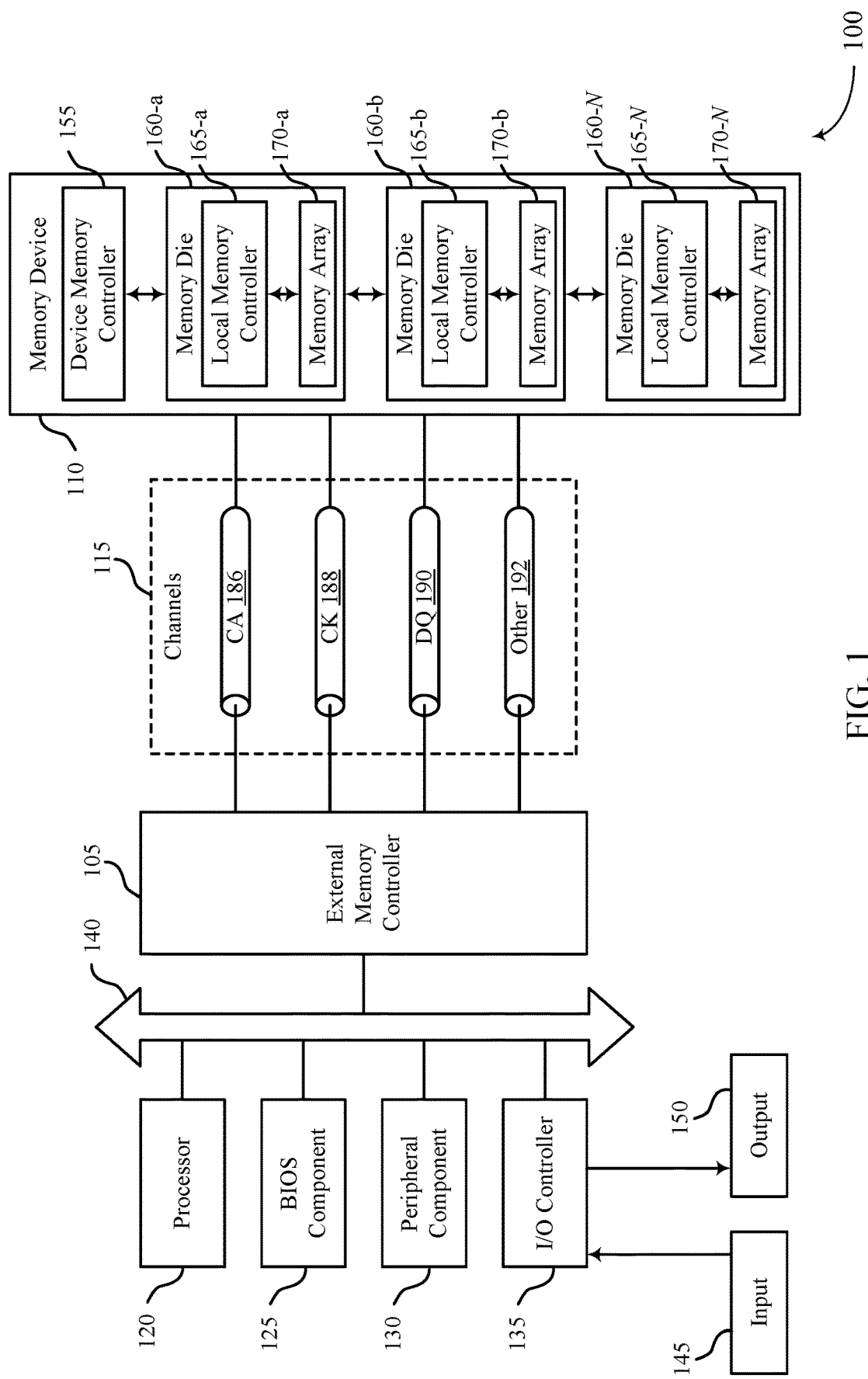
FIG. 1 illustrates an example of a system that supports word line capacitance balancing in accordance with examples as disclosed herein.

An array of memory cells within a memory device may include multiple memory tiles, where a memory tile may be a smallest subarray of adjacent memory cells in the array. Generally, the circuitry or circuit components for the subarrays of memory cells may be shared between adjacent memory tiles. In some cases, a shared memory tile (e.g., at a boundary or edge of a sequence of memory tiles and next to other components, such as components at a periphery of the peripheral components) may have a particular closing configuration that enables the same functionality and device operation at the edge memory tile as with other memory tiles that are not located at the edge. For instance, circuitry including word lines and word line drivers may be configured to be shared among adjacent subarrays, whereas circuitry for memory tiles located at the boundary of the array may be configured differently when adjacent to another subarray.

However, a discontinuity may exist for such memory tiles located at the boundary due to an electrical connection with a single other memory tile. As an example, the load on a word line for a boundary memory tile may be different from (e.g., smaller than) a load on a word line for a non-boundary memory tile. These varying loads may result in different operation of boundary memory tiles as compared to non-boundary memory tiles, where, for example, a smaller load may result in faster resistive capacitive (RC) timing for some tiles, but not others. This inconsistent operation across different memory tiles may affect efficiency and reliability of the memory device in some cases.

As described herein, a new capacitive component may be used to adjust the capacitive load (e.g., of word lines) for boundary memory tiles such that the capacitive load is balanced (e.g., with word lines) with the capacitive load of other, non-boundary, memory tiles. For example, the capacitive component (e.g., a capacitor, an RC circuit) may be coupled with the word line of a boundary memory tile, which may alter or adapt (e.g., increase) the capacitive load of the word line, for example, to match the load of a word line associated with of a non-boundary memory tile. In other cases, the capacitive component may be coupled with an input line providing a source signal for a driver of the boundary memory tile word line. In such cases, the driver's output on the word line may be balanced with other word lines located at memory tiles that are not on the boundary. Additionally or alternatively, an input of the driver for the boundary memory tile word line may be configured to achieve the same increase in capacitance for the word line. For instance, the capacitive component may be coupled with an access line for a source signal to the driver of the boundary memory tile word line. In other examples, a driver providing the source signal may have its resistance configured to adjust the capacitive load at the line for the source signal. In any case, through the increased capacitance of the boundary memory tile word line, the entire array of memory cells may operate consistently, even at the memory tiles and corresponding memory cells located at the edge of the array having different circuitry configurations. The described techniques may likewise enable an RC delay for each memory cell in respective memory tiles to be the matched.

Features of the disclosure are initially described in the context of a memory system and memory die as described with reference to FIGS. 1-3. Features of the disclosure are described in the context of memory tiles as described with reference to FIGS. 4A, 4B, 5A, and 5B. These and other features of the disclosure are further illustrated by and described with reference to a voltage timing diagram as described with reference to FIG. 6.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. For example, and as described in further detail herein, a capacitive component (such as a capacitor, RC circuit, or the like) may be coupled at various locations within system 100, where the capacitive component may adjust an output of a driver (e.g., on a word line). In some cases, the capacitive component may be configured to alter or adapt capacitive loads associated with subarrays of memory cells that are located at an edge of a memory array (such as memory array 170) based on the location of the capacitive component relative to other components. For instance, the capacitive component may enable a capacitive load to be relatively consistent and balanced across different memory tiles across an array.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. In some cases, a memory array 170 may include multiple subarrays or groups of adjacent memory cells. Further, a smallest grouping of adjacent cells (e.g., without separation of any kind) may be referred to as a memory tile or a patch. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
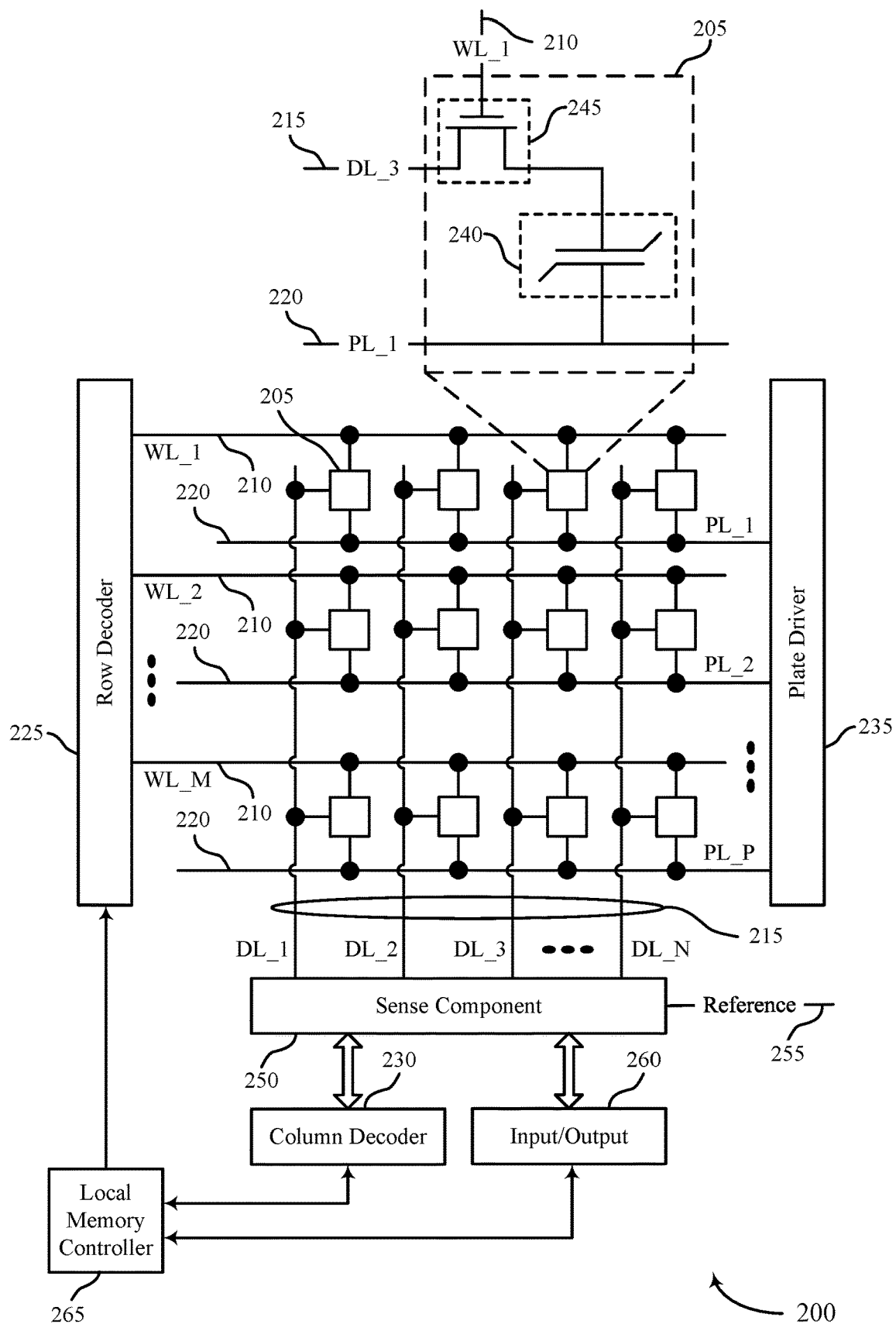
FIG. 2 illustrates an example of a memory die that supports word line capacitance balancing in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component. In some cases, the word line 210 may be shared among adjacent memory tiles in a memory device. For example, a word line 210 may be in electrical communication with memory cells of multiple adjacent memory tiles.

In other cases, such as with a memory tile located at an edge of a memory array, the word line 210 may not be shared with the components of another memory tile. As a result, and as described herein, the word line 210 may also be coupled with a capacitive component that adapts at least a portion of a total capacitive load of an output of a driver for the word line 210. The load may be adjusted by the capacitive component to be balanced relative to (e.g., match, be similar to) the load of another word line 210 for a memory tile that is not located at an edge of the memory array. In such cases, an RC timing may also be adjusted to enable consistent operation of memory cells 205 coupled with the word lines 210.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may include precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
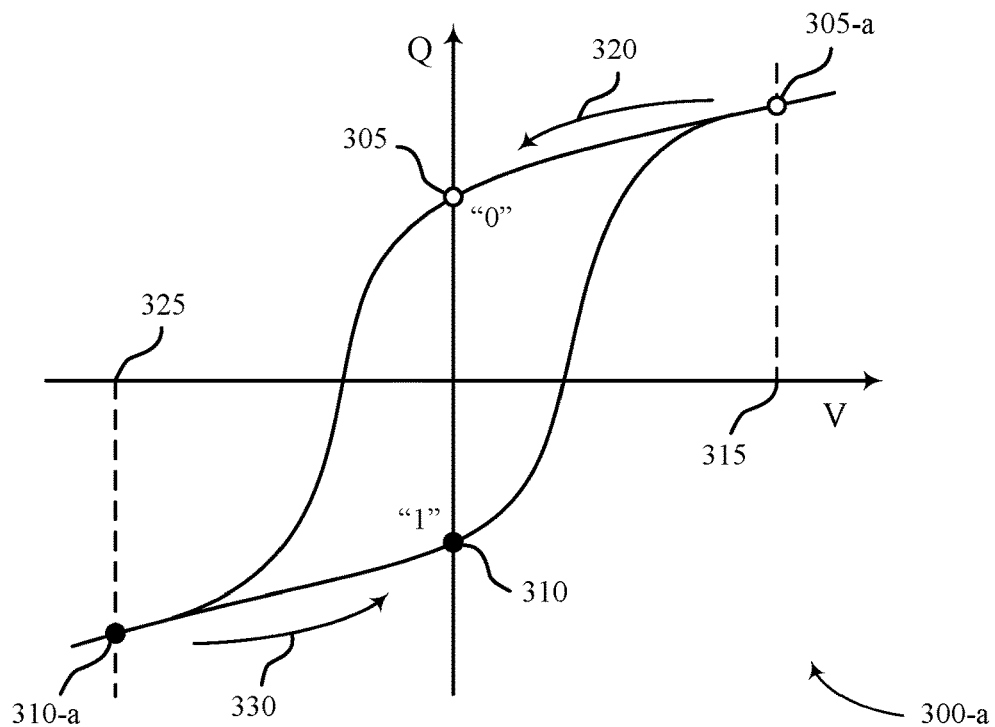
FIGS. 3A and 3B illustrate examples of hysteresis curves that support word line capacitance balancing in accordance with examples as disclosed herein.
Figure 3B:
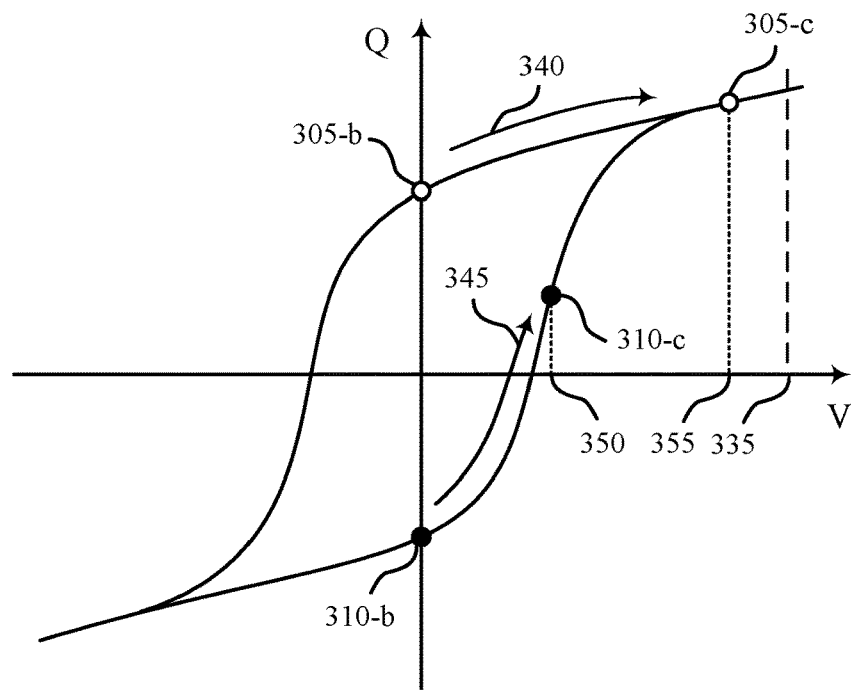

FIGS. 3A and 3B illustrate examples of non-linear electrical properties of a ferroelectric memory cell with hysteresis curves 300-*a* and 300-*b* in accordance with various examples as disclosed herein. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

In some cases, an array of ferroelectric memory cells may include one or more memory tiles, where a respective memory tile may represent a smallest subarray, or compact group, of adjacent memory cells that are not interrupted (such as by sockets or other separations). Further, and as described in further detail herein, a set of sequential memory tiles may be arranged in a direction (e.g., linearly) and may include one or more memory tiles located at the edge of the set, where the edge memory tiles are electrically connected to another memory tile in the set. It is noted that when referring to memory tiles located at an edge, such memory tiles may similarly be referred to herein as being located at a boundary, a periphery, a border, a threshold, or other like terminology, and it is understood that these terms may be used interchangeably. Such edge memory tiles may also include a capacitive component that is specific to edge memory tiles and enables the balancing of a load of an access line associated with the edge memory tile. More specifically, the capacitive component may include a capacitor that balances a capacitive load output from a driver that is coupled with one or more ferroelectric memory cells (e.g., via a word line). In such cases, the capacitive load added by the capacitive component may correspond to the capacitance of one or more ferroelectric memory cells of the edge memory tile. In other cases, the capacitance of the capacitive component may be configured based on one or more other components within a memory device.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-*a* and 300-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some cases, a ferroelectric memory cell may lose its initial logic state after a read operation. For example, if charge state 310-*b* is stored, the charge state may follow path 345 to charge state 305-*c* during a read operation and, after removing voltage 335, the charge state may relax to the charge state 305-*b* by following path 340.

Hysteresis curve 300-*b* illustrates an example of reading a memory cell that is configured to store the charge state 305-*b* and the charge state 310-*b*. A read voltage 335 may be applied, for example, as a voltage difference via a digit line 215 and a plate line 220 as described with reference to FIG. 2. Hysteresis curve 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-*a* (e.g., a logic 1) or at charge state 310-*a* (e.g., a logic 0).

Figure 4A:
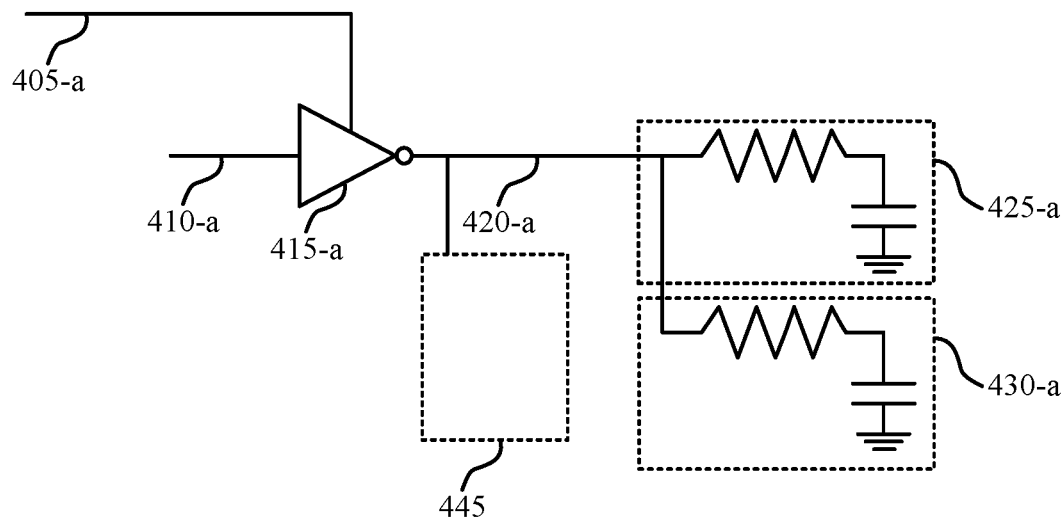
FIGS. 4A and 4B illustrate examples of memory tiles that support word line capacitance balancing in accordance with examples as disclosed herein.
Figure 4B:
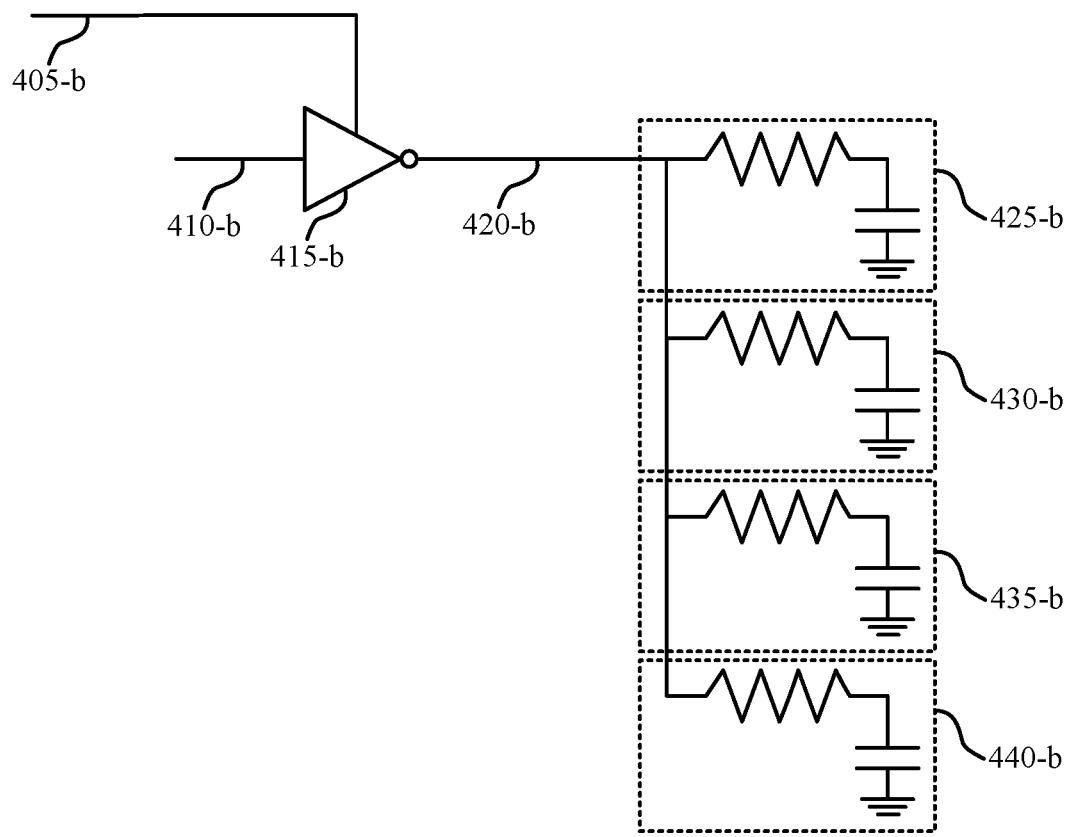

FIGS. 4A and 4B illustrate examples of memory tiles 400-*a* and 400-*b*, respectively, that support word line capacitance balancing in accordance with examples as disclosed herein. In accordance with the techniques disclosed herein, a memory device may include a number of memory tiles (e.g., patches), where each of the memory tiles includes an array portion and a circuit portion. For each memory tile, the array portion may include a number of memory cells (e.g., a subarray of memory cells), and the circuit portion may include circuitry used to operate the memory cells of the array portion (e.g., layer). Such circuitry may include driver circuitry, sensing circuitry, or the like, and may include the various components included in and described with reference to FIGS. 4A and 4B.

A memory device may include multiple memory tiles, for example, in a sequence, row, or other configuration. In some examples, circuitry or circuit components may be shared between respective tiles at the memory device, such as between adjacent tiles in the sequence of memory tiles. In such cases, control circuitry used for timing of sense components may be shared by adjacent memory tiles. In other cases, such circuitry may be specific to some memory tiles. In particular, based on the location of the memory tile, the memory tile may be configured with circuitry configured for the specific location of the memory tile. In some cases, respective drivers may be used to drive circuitry shared by a number of adjacent memory tiles.

In some cases, adjacent memory tiles may experience different loads (e.g., capacitive loads) based on their respective location in the sequence of memory tiles. For example, a memory tile located at the boundary or edge of the sequence of memory tiles may share circuitry with only one other memory tile in the sequence. As a result, the edge memory tile may experience a different (e.g., smaller) load than a separate (e.g., default) memory tile not located at the edge and sharing circuitry with more than one other memory tiles in the sequence.

As an example, FIG. 4A illustrates an example of memory tile 400-*a*, which may be a memory tile located at a boundary or edge of a sequence of memory tiles. Memory tile 400-a may be coupled to another memory tile that is not located at an edge of the sequence of memory tiles (e.g., memory tile 400-b as described with reference FIG. 4B, which may be referred to herein as a default memory tile). Memory tile 400-a may contain a driver 415-a, which may be an example of an inverter, a word line decoder, or an amplifier (e.g., a current sense amplifier), or the like.

In some cases, driver 415-a may receive signals from access lines 405-a and 410-a, which may correspond to the source and gate signals of the driver 415-a, respectively. An output of driver 415-a may accordingly be coupled with a word line 420-a that may provide signaling to the memory cells 425-a and 430-a of memory tile 400-a. In some cases, a source signal received on access line 405-a may be a signal output from a separate driver associated with a different memory tile, or may be part of shared circuitry between adjacent memory tiles. In one example, the sequence of memory tiles may include multiple sections and multiple sets of shared circuitry. At memory tile 400-a, however, there may be no additional circuitry to share between a subsequent memory tile (because there is no subsequent memory tile in the sequence).

Driver 415-a may output a number of signals to drive a current onto the word line 420-a. The signals output from the driver 415-a may, in some examples, be associated with signals acquired from access lines 405-a and 410-a. In some cases, memory cells 425-a and 430-a may be single memory cells, or may correspond to different decks (or layers) of memory cells. The memory cells 425-a and 430-a may contribute to a load (e.g., a capacitive load) present at the driver 415-a and word line 420-a. As such, the capacitive load may be based on the number of memory cells that are coupled with the word line 420-a. In some cases, and as described in further detail below, memory tile 400-a may be adaptably configured to mitigate inconsistencies in capacitive loading on word line 420-a (e.g., with respect to other memory tiles, such as memory tile 400-b) due to the location of memory tile 400-a. For instance, memory tile 400-a may be configured to include a load balancing component 445, which may be operable to balance a load on word line 420-a with a load of other word lines coupled with other subarrays (e.g., with a load on word line 420-b for memory tile 400-b, as described below with reference to FIG. 4B). In some cases, the load balancing component may be an example of a capacitor, RC circuit, or other component, which may be coupled to the circuitry of memory tile 400-a in various ways (e.g., as described with reference to FIGS. 5A and 5B, below). As an example, the load balancing component may additionally or alternatively be coupled with access line 405-a and may add a load to the input of driver 415-a to balance a load of word line 420-a. In any case, the load balancing component may increase a load for access lines coupled with the memory cells of a memory tile.

FIG. 4B is an example of memory tile 400-b (e.g., a default memory tile), which may be a memory tile which is located in between two other memory tiles of the sequence (rather than at a boundary or edge of the sequence of memory tiles and as further illustrated with reference to FIG. 4C). In some examples, memory tile 400-b may be coupled to two other default memory tiles in the sequence, or may alternatively be coupled with one other default memory tile and one edge memory tile (such as memory tile 400-a). As described above with reference to FIG. 4A, memory tile 400-b may include a driver 415-b that is coupled with an access line 405-b providing a source signal (e.g., from another driver, decoder, or inverter) and an access line 410-b providing a gate signal (e.g., associated with a reference voltage). Further, a source signal received on access line 405-b may be a signal output from a separate driver associated with a different memory tile, or may be part of shared circuitry between adjacent memory tiles, among other examples. In one example, the sequence of memory tiles may include multiple sections and multiple sets of shared circuitry. At memory tile 400-b, circuitry may be shared between adjacent tiles.

Driver 415-b may output a number of signals to drive a current onto the word line 420-b. Word line 420-b may be coupled with one or more memory cells, for example, memory cells 425-b, 430-b. 435-b, and 440-b. In some cases, memory cells 425-b, 430-b. 435-b, and 440-b may be single memory cells, or may alternatively be respective decks of memory cells. In some examples, memory cells 425-b and 430-b may comprise a first memory tile (or first subarray) and memory cells 435-b and 440-b may comprise a second memory tile (or second subarray), where circuitry including, for example, driver 415-b and word line 420-b, may be shared between the first and second memory tiles. As such, the memory cells 425-b, 430-b. 435-b, and 440-b may contribute to the load (e.g., the capacitive load) present at the word line 420-b, and the load may be based on the number of memory cells that are coupled with the word line 420-b. As illustrated, the capacitive load on word line 420-b may be greater than (e.g., double) the capacitive load on word line 420-a (described with reference to FIG. 4A), because the word line 420-b may be coupled with two adjacent memory tiles, while the word line 420-a may be coupled with one adjacent memory tile. In some cases, the load balancing component 445 may be configured based on a load experienced by word line 420-b (e.g., based on the load contribution (capacitive or otherwise) from memory cells 425-b, 430-b, 435-b, and 440-b).

The difference in loads experienced by the word lines 420-a and 420-b at the edge memory tile 400-a and the default memory tile 400-b may introduce a number of challenges to operating the memory device. For instance, the difference in loads may cause the edge memory tile to operate according to a different (e.g., faster) resistive-capacitive (RC) time delay than the RC delay of the default tile. In some cases, a smaller load present at the edge memory tile 400-a (as compared to the default memory tile 400-b) may result in the faster RC time delays at the edge memory tile 400-a. Differences in memory tile delay timings across edge and default memory tiles may cause a number of inconsistencies in device operation. For example, inconsistent increases in RC delay may elicit changes to reference timing and sensing operations, among other parameters. As a result, configuring the edge memory tile to operate in a way that is similar to the default memory tile may provide a number of benefits.

Figure 4C:
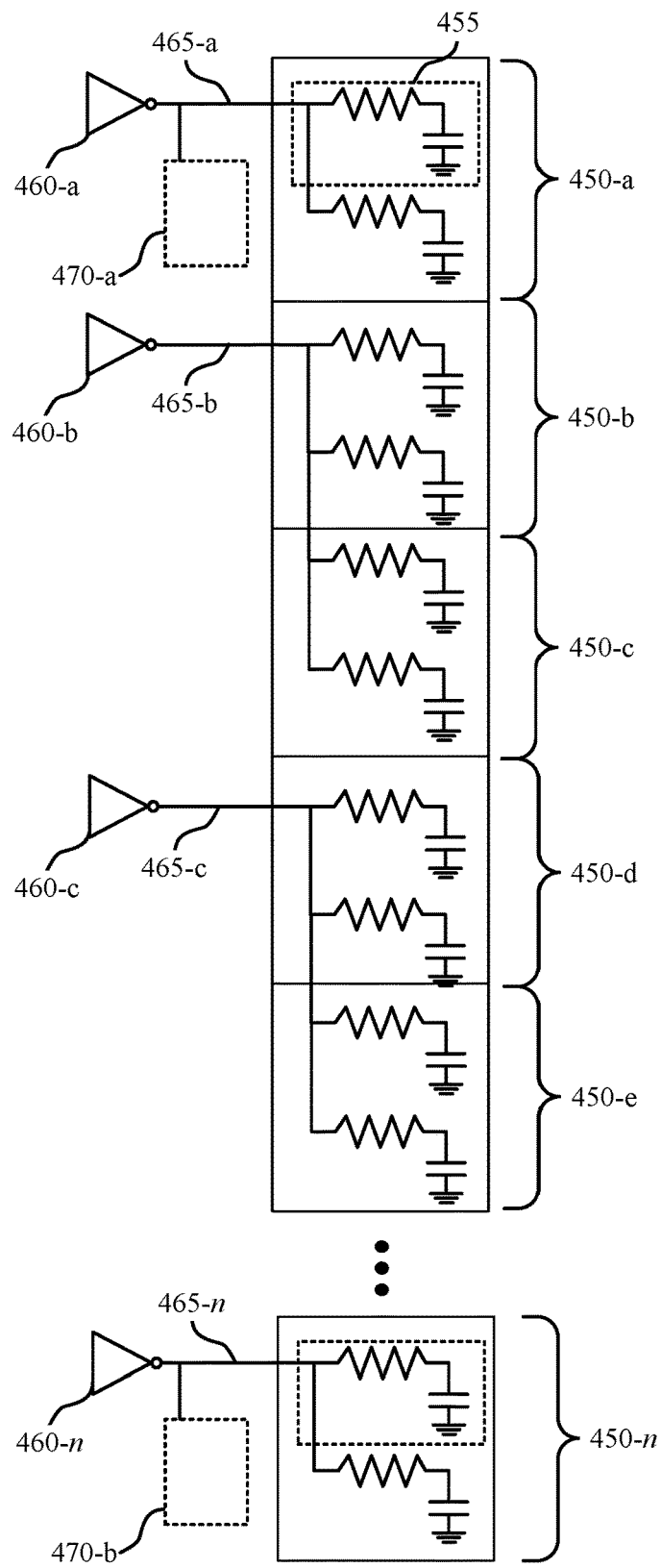
FIG. 4C illustrates an example of a set of memory tiles that support word line capacitance balancing in accordance with examples as disclosed herein.

FIG. 4C illustrates an example of a set of memory tiles 401 that support word line capacitance balancing in accordance with examples as disclosed herein. In particular, the set of memory tiles 401 shows a sequence of adjacent memory tiles 450 (e.g., memory tiles 450-a through 450-n) that each comprise a subarray of memory cells 455. Further, the set of memory tiles 401 may include one or more edge memory tiles, such as edge memory tile 450-a and edge memory tile 450-n, which may be an example of the memory tile 400-a, described with reference to FIG. 4A, and/or the memory tiles 500-a and 500-b, described with reference to FIGS. 5A and 5B. Additionally, the set of memory tiles 401 may include one or more default memory tiles, such as default memory tiles 450-b through 450-e, which may each be an example of memory tile 400-*b* as described with reference to FIG. 4B. Some of the memory tiles 450 of the set of memory tiles 401 may share circuitry, such as one or more drivers 460 and word lines 465. For instance, each of default memory tile 450-*b* and 450-*c* may share a same driver 460-*b* and word line 465-*b* for the memory cells associated with default memory tiles 450-*b* and 450-*c*.

As described herein, the edge memory tiles (e.g., memory tiles 450-*a* and 450-*n*) may further include an additional load balancing component 470 (e.g., load balancing component 470-*a* and load balancing component 470-*b*). Each load balancing component 470 may be an example of the load balancing component 445 described with reference to FIG. 4A, and may also be an example of the capacitive components 530-*a* and 530-*b* described with reference to FIGS. 5A and 5B. For instance, the load balancing component may include a capacitor, or an RC circuit, or other circuitry that adds a load (e.g., a capacitive load) to a word line 465. Through the inclusion of the load balancing components 470 (e.g., a capacitive component) at the edge memory tiles 450-*a* and 450-*n* of the set of memory tiles, the capacitive load for word lines 465-*a* and 465-*n* at the edge memory tiles may be balanced with a capacitive load at the word lines 465-*b* and 465-*c* of the default memory tiles 450-*b* through 450-*e*. In some examples, the load balancing components may be configured based on the components included in or coupled with the subarrays of memory cells 455 of each memory tile 450 to enable consistent operation (such as a same RC delay) across the set of memory tiles 401.

Figure 5A:
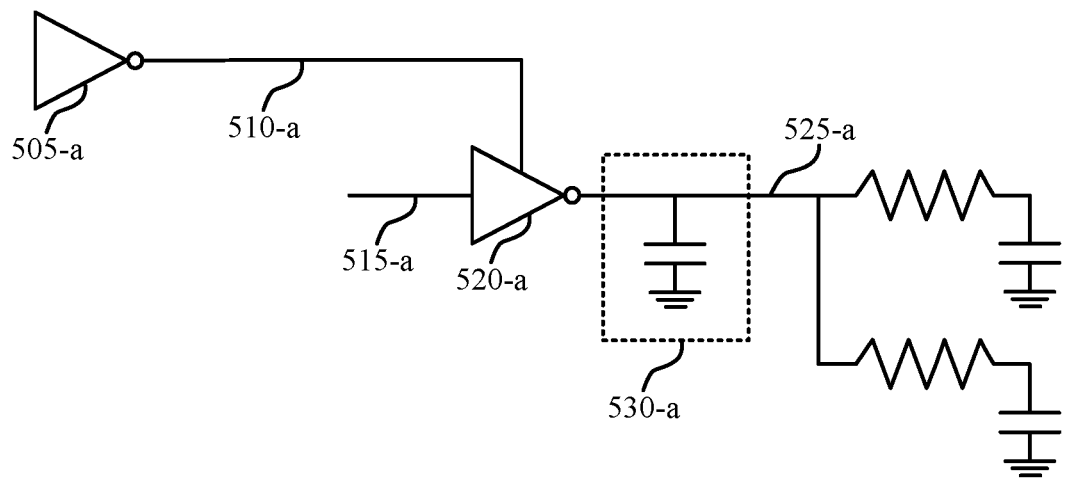
FIGS. 5A and 5B illustrate examples of memory tiles that support word line capacitance balancing in accordance with examples as disclosed herein.
Figure 5B:
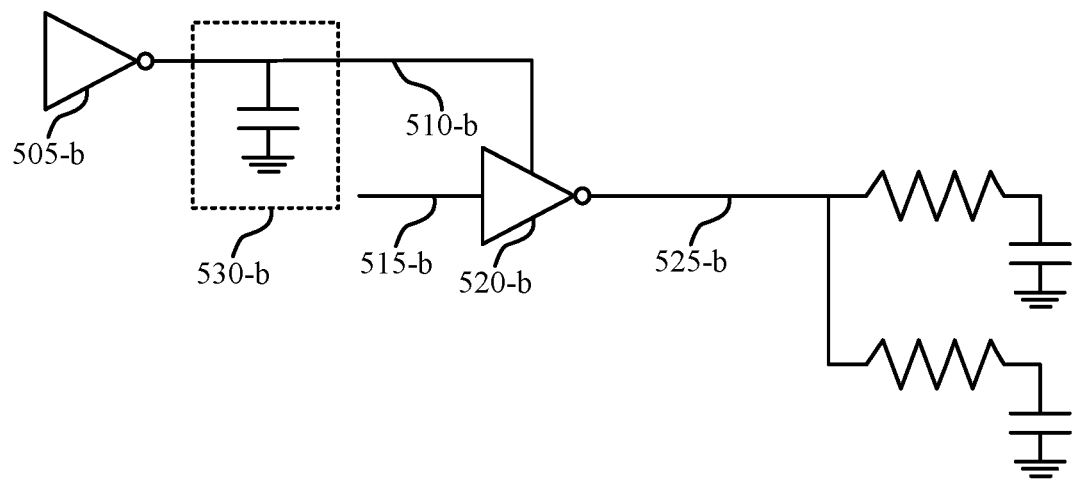

FIGS. 5A and 5B illustrate examples of a memory tile 500-*a* and 500-*b*, respectively, that support word line capacitance balancing in accordance with examples as disclosed herein. Memory tiles 500-*a* and 500-*b* may illustrate an example of capacitive components added to an edge memory tile (such as memory tile 400-*a* described with reference to FIG. 4A) that enable a balanced capacitive load across a set of memory tiles.

For instance, FIG. 5A is an example of memory tile 500-*a*, which may be a memory tile located at a boundary or edge of a sequence of memory tiles. In some examples, memory tile 500-*a* may be coupled with a default memory tile (e.g., memory tile 400-*b* as described with reference FIG. 4B). Memory tile 500-*a* may further include one or more drivers 505-*a* and 520-*a*, which may be examples of inverters or amplifiers (e.g., current sense amplifiers). In some cases, driver 505-*a* may drive a signal on access line 510-*a*, and driver 520-*a* may receive the signal using access line 510-*a*. In addition, the driver 520-*a* may receive a number of other signals as inputs using access line 515-*a*. In some cases, the driver 505-*a* may be associated with a different memory tile, or may be part of shared circuitry between memory tiles.

Driver 520-*a* may output signals to drive a current onto the word line 525-*a*, where word line 525-*a* may be coupled with one or more memory cells or decks of memory cells. The memory cells may contribute to the load (e.g., a capacitive load) present at the word line 525-*a*. The load may be based on the number of memory cells that are coupled with the word line 525-*a*, and may in some examples be different (e.g., less) than the load experienced at associated word lines coupled with other memory tiles not located at the edge of the memory tile sequence.

In one example, the sequence of memory tiles may include multiple sections and sets of shared circuitry. In some cases, a sequence of memory tiles comprises a number (e.g., seven) adjacent subarrays or tiles, with each memory tile including associated circuitry located below one or more of the tiles. In some cases, the circuitry may be shared between adjacent memory tiles in the sequence, and in other cases, the circuitry may be specific to a given memory tile in the sequence. For instance, the first memory tile and the last memory tile in the sequence (e.g., the edge memory tiles) may be configured with a particular beginning or terminating component such that the associated circuitry remains consistent between different memory tiles in the array. Some circuit components such as word line decoders for the sequence of tiles may be shared between two adjacent tiles in the memory device. The first and last patch, however, may include a termination component for the word line decoders and other shared circuitry that may not be shared past the edge of the array. In another implementation, the termination component may be a separate edge array or edge tile that may be configured based on the location of the memory tile.

In some cases, the word line (e.g., word line 525-*a*) and driver (e.g., driver 520-*a*) for an edge tile may be coupled with a capacitor 530-*a*, such that the word line load at the edge tile is the same as the word line and driver coupled with a default tile. The word line and driver at the default memory tile may drive a word line associated with two adjacent tiles, where the driver 520-*a* for the edge tile may drive one word line 525-*a* associated with one adjacent tile. The word line 525-*a*, however, may be coupled with a capacitive load (e.g., capacitor 530-*a*) equal to that contributed by an additional tile. In some examples, the additional capacitive load may balance the loads between the default and edge tiles, such that the capacitive load across all tiles of the sequence of tiles is the same.

Differences in the capacitive loads present at word lines of default and edge tiles may additionally cause differences in RC delay. In some cases, an additional capacitive load may be coupled with the driver 520-*a* at an edge memory tile to match the RC delay and associated load at respective word lines of default tiles. In some examples, the value of the capacitive load contributed by a memory cell to the word line may be represented by C. This capacitance value may be additive such that the load contributed by 2 memory cells coupled with the word line is 2C, the load contributed by 3 memory cells is 3C, and so on. In the example of FIG. 5A, the additional load may be a capacitor 530-*a* placed at word line 525-*a*. In order to balance the word line of the edge tile, an additional capacitive load (e.g., 2C) may be added using a capacitor. The capacitive load at the word line 525-*a* may additionally be modified by other methods as well, such as the inclusion of an RC circuit or other types of capacitive components not explicitly described herein.

FIG. 5B is another example of memory tile 500-*b*, which may be a memory tile which is located at a boundary or edge of the sequence of memory tiles. In some examples, memory tile 500-*b* may be coupled to a default memory tile (e.g., memory tile 400-*b* as described with reference FIG. 4B). Memory tile 500-*b* may include a 520-*b*, where another driver 505-*b* may drive a source signal or current on access line 510-*b*, and driver 520-*b* may receive the signal using access line 510-*b*. In addition, the driver 520-*b* may receive another input signal(s), such as a gate signal, on access line 515-*b*. In some cases, the driver 505-*b* may be associated with a different memory tile, or may be part of shared circuitry between memory tiles.

Driver 520-*b* may output a number of signals to drive a current onto the word line 525-*b*. Word line 525-*b* may be coupled with one or more memory cells or decks of memory cells. The memory cells may contribute to the load (e.g., a capacitive load) present at the word line 525-*b*. The load may be based on the number of memory cells that are coupled with the word line 525-b and may, in some examples, be different (e.g., less) than the load experienced at associated word lines coupled with other memory tiles not located at the edge of the memory tile sequence.

Differences in the capacitive loads present at word lines of default and edge tiles may additionally cause differences in RC delay. In some cases, RC delays may be matched at respective word lines, for example, by adding an additional capacitive load (e.g., 2C) to the driver 505-b for the edge memory tile. In the example of FIG. 5B, the additional load may be a capacitor 530-b placed at access line 510-b.

Figure 6:
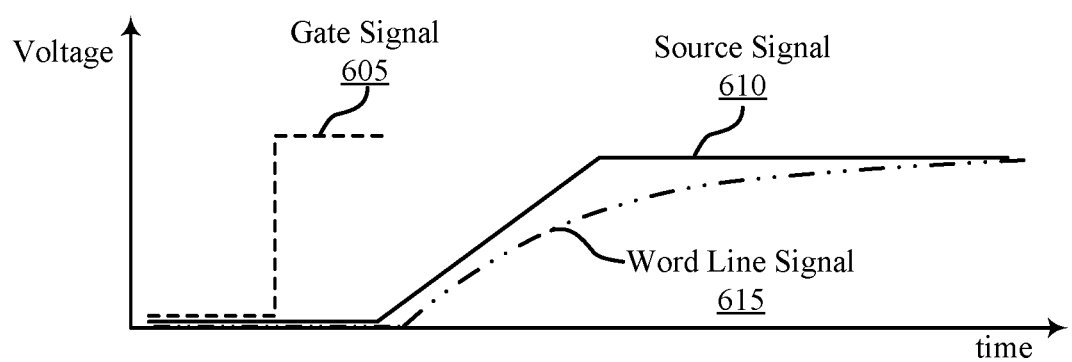
FIG. 6 illustrates an example of a voltage timing diagram that supports word line capacitance balancing in accordance with examples as disclosed herein.

FIG. 6 illustrates an example of a voltage timing diagram 600 that supports word line capacitance balancing in accordance with examples as disclosed herein. Voltage timing diagram 600 may illustrate voltage value trends over time for various signals at the memory device. Gate signal 605 may, in some cases, be a signal input at the gate of word line driver, and may be conveyed, for example using access lines 410 and 515 as described with reference to FIGS. 4A, 4B, 5A, and 5B. Source signal 610 may in some cases be conveyed using access lines 405 and 510 as described with reference to FIGS. 4A-5B. In some cases, source signal 610 may drive a word line, or may be another signal output from a driver of the access line. In addition, word line signal 615 may be conveyed using word lines 420 and 525, as described with reference to FIGS. 4A-5B.

Voltage timing diagram 600 displays voltage associated with the word line signal 615 following (e.g., tracking) the voltage of source signal 610 as a function of time at a memory tile. For a default memory tile, there may be a difference in voltage and time between the source signal 610 and the word line signal 615. In some cases, this difference may be due to a voltage drop and corresponding delay at the various drivers coupled with the source lines and word line. However, voltage timing diagram 600 may represent a same voltage tracking for both default memory tiles and boundary memory tiles that include a load balancing component (e.g., a capacitive component) coupled with a driver of a word line and memory cells of the boundary memory tile, as described herein. In other words, an added capacitive load may achieve the same voltage tracking for boundary memory tiles as for default memory tiles, even when boundary memory tiles may be configured differently (e.g., located at an edge and coupled with one other memory tile).

In some cases, an additional resistance may be added to the driver of the source signal, or alternatively, an additional capacitive load (e.g., a capacitor) may be added to the source signal. Adding the additional resistance or additional capacitive load at a source line conveying the source signal may in some examples minimize the difference in voltage and time between the source signal 610 and the word line signal 615. Such added resistance or capacitance for edge memory tiles may also enable the RC delay for edge memory tiles to be the same as the RC delays for default memory tiles. Stated alternatively, the word line signal 615 may track source signal 610 faster with the addition of the additional capacitor, and may provide a closer match between the source signal 610 and the word line signal 615.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory tile located at a boundary of a set of memory tiles and including an array of memory cells, a word line coupled with the array of memory cells and a driver, the word line associated with a total capacitive load, and a capacitive component coupled with the driver to adapt a load output from the driver to the array of memory cells, the load comprising at least a portion of the total capacitive load.

In some examples, the set of memory tiles may include operations, features, means, or instructions for a first subset of memory tiles, each memory tile in the first subset being adjacent to two other memory tiles of the set, and a second subset of memory tiles, each memory tile in the second subset being adjacent to one other memory tile of the set, where the second subset includes the memory tile located at the boundary.

In some examples, the memory tile at the boundary shares an electrical connection with a memory tile of the first subset. In some examples, each memory tile of the first subset shares an electrical connection with two memory tiles of the first subset or a first memory tile of the first subset and a second memory tile of the second subset.

In some examples, the capacitive component may be associated with a first capacitance that may be greater than a second capacitance of a memory cell of the array of memory cells. In some examples, the first capacitance may be double the second capacitance. In some examples, each memory tile of the first subset may be configured according to a first RC delay, and each memory tile of the second subset may be configured according to a second RC delay. In some examples, the first RC delay may be longer than the second RC delay.

In some examples, the total capacitive load comprises a capacitance associated with the word line and an additional capacitance associated with the capacitive component. In some examples, the capacitive component includes a capacitor or an RC circuit. In some examples, the load includes a capacitive load added to an input of the driver and comprises at least a portion of the total capacitive load. In some examples, the capacitive component balances the load output from the driver based on a load common to a set of word lines for the array of memory cells. Some examples of the apparatus may include a set of drivers, where each driver of the set of drivers may be associated with at least two adjacent memory tiles of the set of memory tiles.

In some examples, a first word line associated with a first memory tile of the first subset of memory tiles has a same total capacitive load as a second word line associated with a second memory tile of the second subset of memory tiles, the second word line and second memory tile coupled with the capacitive component.

An apparatus is described. The apparatus may include a first line coupled with an input of a driver, a second line coupled with an output of the driver, the second line associated with a total capacitive load, a set of memory cells coupled with the second line, and a capacitive component coupled with the second line, the capacitive component adapting a load output from the driver to the set of memory cells, the load comprising at least a portion of the total capacitive load.

In some examples, the second line includes a word line for the set of memory cells. In some examples, the set of memory cells include a memory tile located at a boundary of a sequence of memory tiles. In some examples, the capacitive component adds a first capacitance to the total capacitive load at the second line, the first capacitance being the same as a second capacitance from the set of memory cells. In some examples, the capacitive component increases at least a portion of the total capacitive load output from the driver. In some examples, a total capacitive load associated with the first line is the same as the total capacitive load associated with the second line, the second line being coupled with the capacitive component.

An apparatus is described. The apparatus may include a set of memory tiles of a memory array, where a first memory tile of the set of memory tiles is configured as a first type of memory tile sharing an electrical connection with two other memory tiles in the memory array, and where a second memory tile of the set of memory tiles is configured as a second type of memory tile sharing an electrical connection with one other memory tile in the memory array and a capacitive component that adapts at least a portion of a total capacitive load for the second memory tile.

In some examples, each of the first memory tile and the second memory tile include a driver coupled with a word line, each driver driving at least a portion of the total capacitive load at the word lines, and where a first load at a first word line of the first memory tile may be the same as a second load at a second word line of the second memory tile based on the capacitive component.

In some examples, the capacitive component may be coupled with a driver for the second memory tile, and where the second load may be based on the capacitive component adapting an output from the driver for the second memory tile. In some examples, the first memory tile may be associated with a first RC delay and the second memory tile may be associated with a second RC delay that matches the first RC delay based on the capacitive component.

In some examples, the set of memory tiles extends linearly in a direction on the memory array, and where a set of memory tiles of the first type may be bounded by memory tiles of the second type. In some examples, the first memory tile shares the electrical connection with two respective memory tiles configured as the first type or with a memory tile configured as the first type and a memory tile configured as the second type. Some examples may further include one or more memory tiles configured as the second type may be located at an edge of the set of memory tiles.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a first memory tile located at a boundary of a plurality of memory tiles and comprising an array of memory cells;
    a word line coupled with the array of memory cells and an output of a driver, the word line associated with a first load;
    an access line coupled with an input of the driver and configured to convey signals to the driver; and
    a load balancing component coupled with the access line and the input of the driver, the load balancing component configured to balance the first load with a second load associated with a second memory tile of the plurality of memory tiles.

2. The apparatus of claim 1, wherein the load balancing component is associated with a first capacitance that is greater than a second capacitance of a memory cell of the array of memory cells.

3. The apparatus of claim 2, wherein the first capacitance is based at least in part on the second capacitance and a quantity of memory cells of the array of memory cells of the first memory tile.

4. The apparatus of claim 1, wherein the load balancing component is configured to match a first resistive-capacitive (RC) delay for the first memory tile and a second RC delay for the second memory tile based at least in part on an additional load added to the driver.

5. The apparatus of claim 1, further comprising:
    a second driver configured to drive a source signal or current on the access line, wherein the second driver is coupled with the load balancing component via the access line.

6. The apparatus of claim 1, wherein a total load associated with the word line comprises a capacitance associated with the first load and an additional capacitance associated with the load balancing component.

7. The apparatus of claim 1, wherein the load balancing component comprises a capacitor or a resistor-capacitor (RC) circuit.

8. The apparatus of claim 1, wherein the plurality of memory tiles comprise a sequence of memory tiles extending linearly in a direction and further comprises:
    a first subset of memory tiles, each memory tile in the first subset of memory tiles being adjacent to one other memory tile of the plurality, wherein the first subset of memory tiles includes the first memory tile; and a second subset of memory tiles, each memory tile in the second subset of memory tiles being adjacent to two other memory tiles of the plurality, wherein the second subset of memory tiles includes the second memory tile.

9. The apparatus of claim 8, wherein the first memory tile shares an electrical connection with the second memory tile of the second subset of memory tiles.

10. The apparatus of claim 8, wherein each memory tile of the first subset of memory tiles is configured according to a first resistive-capacitive (RC) delay, and each memory tile of the second subset of memory tiles is configured according to a second RC delay.

11. The apparatus of claim 8, wherein a second word line associated with the second memory tile of the second subset of memory tiles has the second load that is greater than the first load associated with the word line, and wherein a total load associated with the word line is the same as the second load, the total load comprising the first load and a load of the load balancing component.

12. The apparatus of claim 1, further comprising:
a plurality of drivers, wherein each driver of the plurality of drivers is associated with at least two adjacent memory tiles of the plurality of memory tiles.

13. An apparatus, comprising:
a first line coupled with an input of a driver;
a second line coupled with an output of the driver, the second line associated with a first load;
a first plurality of memory cells coupled with the second line; and
a load balancing component coupled with the first line and the input of the driver, the load balancing component configured to balance the first load associated with the second line and the first plurality of memory cells with a second load associated with a second plurality of memory cells, wherein the first load comprises at least a portion of a total load associated with the driver.

14. The apparatus of claim 13, wherein the second line comprises a word line for the first plurality of memory cells.

15. The apparatus of claim 13, wherein the first plurality of memory cells comprise a first memory tile located at a boundary of a sequence of memory tiles and the second plurality of memory cells comprise a second memory tile adjacent to two other memory tiles of the sequence of memory tiles.

16. The apparatus of claim 13, wherein the load balancing component adds a first capacitance to the total load associated with the driver, the first capacitance being the same as a second capacitance from the first plurality of memory cells.

17. The apparatus of claim 13, wherein the load balancing component increases the total load associated with the driver, wherein the total load is a total capacitive load.

18. An apparatus, comprising:
a first memory tile;
a first line coupled with a first plurality of memory cells of the first memory tile, the first line and the first plurality of memory cells associated with a first load that is less than a second load associated with a second plurality of memory cells of a second memory tile; and
a driver coupled with the first line, the driver associated with a total load that comprises at least the first load and a third load associated with a load balancing component coupled to an input of the driver, wherein the driver is operable to output a plurality of signals onto the first line in accordance with a first delay.

19. The apparatus of claim 18, wherein the first delay is a first resistive-capacitive (RC) delay that is the same as a second RC delay associated with the second memory tile based at least in part on the load balancing component being coupled to the input of the driver.

20. The apparatus of claim 18, wherein the total load is the same as the second load based at least in part on the load balancing component being coupled to the input of the driver.

* * * * *